(12) United States Patent
Feng et al.

(10) Patent No.: US 11,817,028 B2
(45) Date of Patent: *Nov. 14, 2023

(54) GATE DRIVING STRUCTURE HAVING OVERLAPPED SIGNAL WIRING AND CAPACITOR, ARRAY SUBSTRATE AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Pan Xu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/077,269

(22) Filed: Dec. 8, 2022

(65) Prior Publication Data
US 2023/0125979 A1   Apr. 27, 2023

Related U.S. Application Data

(63) Continuation of application No. 17/015,475, filed on Sep. 9, 2020, now Pat. No. 11,562,673.

(30) Foreign Application Priority Data

Sep. 10, 2019   (CN) .......................... 201910853971.3

(51) Int. Cl.
*G09G 5/00*   (2006.01)
*G09G 3/20*   (2006.01)
(Continued)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............. G09G 3/20; G09G 2300/0426; G09G 2310/0267; G09G 2310/0286;
(Continued)

(56) References Cited

U.S. PATENT DOCUMENTS

2013/0153941 A1* 6/2013 Sasaki ................. G09G 3/3611
257/532
2015/0070616 A1   3/2015 Ogasawara
(Continued)

FOREIGN PATENT DOCUMENTS

CN   103941507 A   7/2014
CN   104297970 A   1/2015
(Continued)

OTHER PUBLICATIONS

Office action from U.S. Appl. No. 17/015,475 dated May 10, 2021.
(Continued)

*Primary Examiner* — Adam J Snyder
(74) *Attorney, Agent, or Firm* — Calfee, Halter & Griswold LLP

(57) ABSTRACT

The present disclosure relates to the field of display technology, and in particular, to a gate driving structure, an array substrate and a display device. The gate driving structure may include: a base substrate; a shift register, formed on the base substrate, and including a plurality of thin film transistors and at least one capacitor, the capacitor being coupled to the thin film transistor; and a signal wiring group, formed on the base substrate, and including a plurality of signal wirings spaced apart from each other, the signal wiring being coupled to the thin film transistor. An orthographic projec- (Continued)

tion of the capacitor on the base substrate is at least partially overlapped with an orthographic projection of the signal wiring group on the base substrate.

12 Claims, 8 Drawing Sheets

(51) Int. Cl.
*G11C 19/28* (2006.01)
*H01L 27/12* (2006.01)
(52) U.S. Cl.
CPC .............. *G09G 2310/0267* (2013.01); *G09G 2310/0286* (2013.01); *G09G 2310/08* (2013.01); *H01L 27/124* (2013.01); *H01L 27/1255* (2013.01)
(58) Field of Classification Search
CPC .............. G09G 2310/08; G11C 19/228; H01L 27/124; H01L 27/1255
See application file for complete search history.

(56) References Cited

U.S. PATENT DOCUMENTS

| | | | |
|---|---|---|---|
| 2015/0138466 A1* | 5/2015 | Mori | G09G 3/3677 349/38 |
| 2017/0249916 A1 | 8/2017 | Jen | |
| 2018/0337682 A1 | 11/2018 | Takasugi | |

FOREIGN PATENT DOCUMENTS

| | | | | |
|---|---|---|---|---|
| CN | 104465787 A | | 3/2015 | |
| CN | 104536223 A | | 4/2015 | |
| CN | 104576656 A | | 4/2015 | |
| CN | 104900655 A | | 9/2015 | |
| CN | 106098726 A | | 11/2016 | |
| CN | 106547127 A | * | 3/2017 | ....... G02F 1/136227 |
| CN | 106547127 A | | 3/2017 | |
| CN | 207650508 U | | 7/2018 | |
| CN | 108563082 A | | 9/2018 | |
| CN | 108766334 A | | 11/2018 | |
| CN | 109637447 A | | 4/2019 | |
| CN | 110071119 A | | 7/2019 | |
| KR | 20170078978 A | | 7/2017 | |

OTHER PUBLICATIONS

Notice of Allowance from U.S. Appl. No. 17/015,475 dated Feb. 2, 2022.
Office action from U.S. Appl. No. 17/015,475 dated Apr. 13, 2022.
Office action from U.S. Appl. No. 17/015,475 dated Oct. 1, 2021.
Notice of Allowance from U.S. Appl. No. 17/015,475 dated Sep. 6, 2022.
Communication from Chinese Application No. 201910853971.3 dated May 25, 2022.
Communication from Chinese Application No. 201910853971.3 dated Nov. 7, 2022.
Office action from Chinese Application No. 201910853971.3 dated Dec. 28, 2021.
Office action from Chinese Application No. 201910853971.3 dated May 24, 2021.

* cited by examiner

GATE DRIVING STRUCTURE HAVING OVERLAPPED SIGNAL WIRING AND CAPACITOR, ARRAY SUBSTRATE AND DISPLAY DEVICE

CROSS-REFERENCE

This application is a continuation application of U.S. application Ser. No. 17/015,475, filed Sep. 9, 2020, which is based upon and claims priority to Chinese Patent Application No. 201910853971.3, filed on Sep. 10, 2019, the entire contents thereof are incorporated herein by reference.

TECHNICAL FIELD

The present disclosure relates to the field of display technology, and in particular, to a gate driving structure, an array substrate and a display device.

BACKGROUND

In the display field, a gate driving structure can be used to effectively reduce display defects and costs. Each stage of shift register in the gate driving structure includes at least one capacitor. However, the capacitor occupies a large area, which is bad for a narrow bezel design.

It should be noted that the information disclosed in the background part above is only used to improve the understanding of the background of the present disclosure, and therefore may include information that does not constitute the prior art known to those skilled in the art.

SUMMARY

The present disclosure provides a gate driving structure, an array substrate and a display device, which are beneficial to a narrow bezel design.

A first aspect of the present disclosure provides a gate driving structure, including: a base substrate; a shift register, formed on the base substrate, and including a plurality of thin film transistors and at least one capacitor, the capacitor being coupled to the thin film transistor; and a signal wiring group, formed on the base substrate, and including a plurality of signal wirings spaced apart from each other, the signal wiring being coupled to the thin film transistor. An orthographic projection of the capacitor on the base substrate is at least partially overlapped with an orthographic projection of the signal wiring group on the base substrate.

In an exemplary embodiment of the present disclosure, the base substrate includes a first area and a second area, and the second area is arranged at a side of the first area close to a display area; the plurality of signal wirings includes a plurality of first signal wirings and a plurality of second signal wirings, the plurality of first signal wirings are formed in the first area and spaced apart from each other, and the plurality of second signal wirings are formed in the second area and spaced apart from each other; and the capacitor is formed in the second area and is located on a side of the second signal wiring facing the base substrate.

In an exemplary embodiment of the present disclosure, the base substrate further includes a third area, and the third area is arranged at a side of the second area close to the display area; and each of the thin film transistors is formed in the third area.

In an exemplary embodiment of the present disclosure, the base substrate further includes a third area, and the third area is disposed between the first area and the second area; and each of the thin film transistors is formed in the third area.

In an exemplary embodiment of the present disclosure, the first signal wiring is a clock signal wiring, and the second signal wiring is a DC signal wiring.

In an exemplary embodiment of the present disclosure, the signal wiring is arranged in a same layer as and is coupled to a source and drain layer of the thin film transistor in the shift register.

In an exemplary embodiment of the present disclosure, the capacitor includes a first electrode layer, a first insulating layer, and a second electrode layer sequentially formed on the base substrate; and the first electrode layer is arranged in a same layer as and is coupled to a gate layer of the thin film transistor in the shift register, and the second electrode layer can be arranged in a same layer as and be coupled to a gate layer of a sub-pixel unit in a display area.

In an exemplary embodiment of the present disclosure, the shift register further includes an output line arranged in a same layer as the second electrode layer, and the output line includes one end coupled to the second electrode layer and another end extending to a position where the display area is located and coupled to the gate layer of the sub-pixel unit.

A second aspect of the present disclosure provides an array substrate including a display area and a non-display area. The array substrate includes a display structure and any one of the above described gate driving structures. The display structure is located in the display area, and the gate driving structure is located in the non-display area and coupled to the display structure.

A third aspect of the present disclosure provides a display device, including the array substrate described above.

In the gate driving structure, array substrate, and display device provided in the present disclosure, the orthographic projection of the capacitor on the base substrate is at least partially overlapped with the orthographic projection of the signal wiring group on the base substrate. That is, at least part of the capacitor is arranged in an area where the signal wiring group is located, so that a space occupied by the gate driving structure may be reduced greatly without affecting a normal work thereof, therefore an area of non-display area can be saved, which is beneficial to a narrow bezel design.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments according to the present disclosure, and server to, together with the specification, explain the principle of the present disclosure. Obviously, the drawings in the following description are only some embodiments of the present disclosure. For those skilled in the art, other drawings may be obtained based on these drawings without creative work.

DETAILED DESCRIPTION

Figure 1:
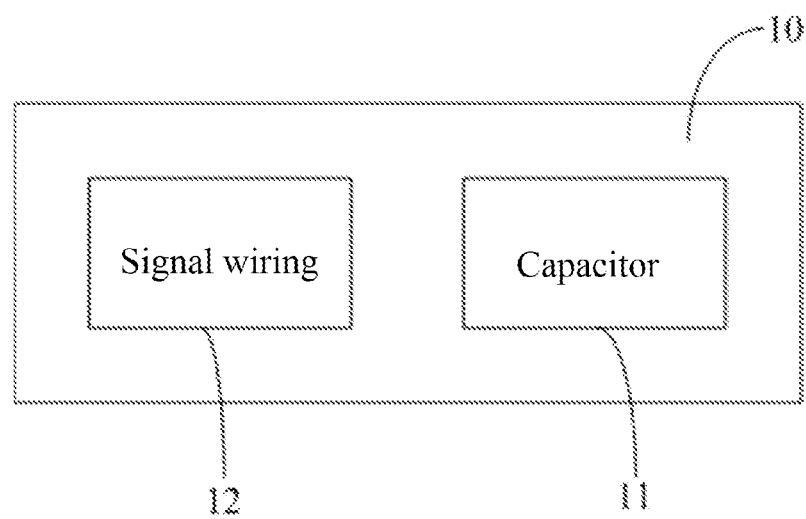
FIG. 1 shows a schematic diagram of distribution of capacitors and signal wirings on a base substrate of a gate driving structure in the related art.

Example embodiments will now be described more fully with reference to the accompanying drawings. However, the example embodiments may be implemented in various forms, and should not be construed as being limited to the embodiments set forth herein; on the contrary, these embodiments are provided so that the present disclosure will be comprehensive and complete, and fully convey the concept of the example embodiments to those skilled in the art. The same reference numerals in the figures represent the same or similar structures, and thus their detailed descriptions will be omitted.

Although relative terms such as "on" and "under" are used in the specification to describe the relative relationship between one component and another component shown, these terms are used in the specification only for convenience of description, for example, according to an example direction in the drawings. It can be understood that if a device shown is turned upside down, a component described as "on" will become a component as "under". When a structure is "on" another structure, it may mean that the structure is integrally formed on another structure, or that the structure is "directly" arranged on another structure, or that the structure is "indirectly" arranged on another structure through other structure.

As a display device with a narrow bezel currently becomes more and more popular, a display device with a narrower bezel is required. Therefore, it is necessary to make a gate driving (for example, a gate driver on array, GOA) structure smaller and smaller, so as to save an area of a non-display area and realize a narrow bezel design.

In the related art, the gate driving structure may include a plurality of stages of shift registers and a plurality of signal wirings. The shift register and the signal wiring are arranged in different areas of a base substrate. That is, an orthographic projection of the shift register on the base substrate is not overlapped with the orthographic projection of the signal wiring on the base substrate.

Each of the shift registers may include a plurality of thin film transistors and at least one capacitor. The shift register and the signal wiring are arranged in different areas of the base substrate, for example, as shown in FIG. 1, a capacitor 11 in the shift register and a signal wiring 12 are arranged in different areas of a base substrate 10. The capacitor 11 is generally plate-shaped. The plate-shaped capacitor may include a first electrode layer, an insulating layer, and a second electrode layer arranged sequentially. The first electrode layer and the second electrode layer are parallel to each other and are opposite to each other at least partially. In order to realize such capacitor and ensure a design specification of the capacitor, the first electrode layer and the second electrode layer in the gate driving structure shall have a relatively large opposite area, and thus the first electrode layer and the second electrode layer shall occupy a large area, which is not beneficial to a narrow bezel design.

Figure 2:
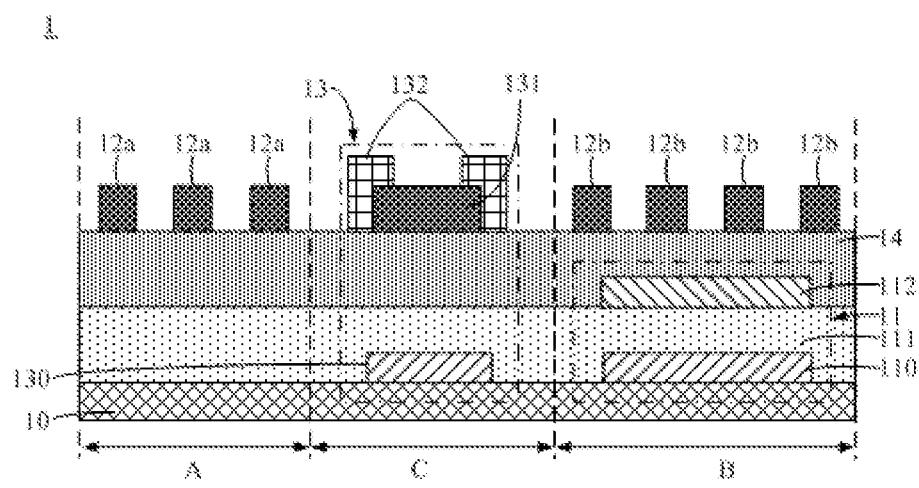
FIG. 2 shows a schematic cross-sectional view of a gate driving structure according to an embodiment of the present disclosure.
Figure 3:
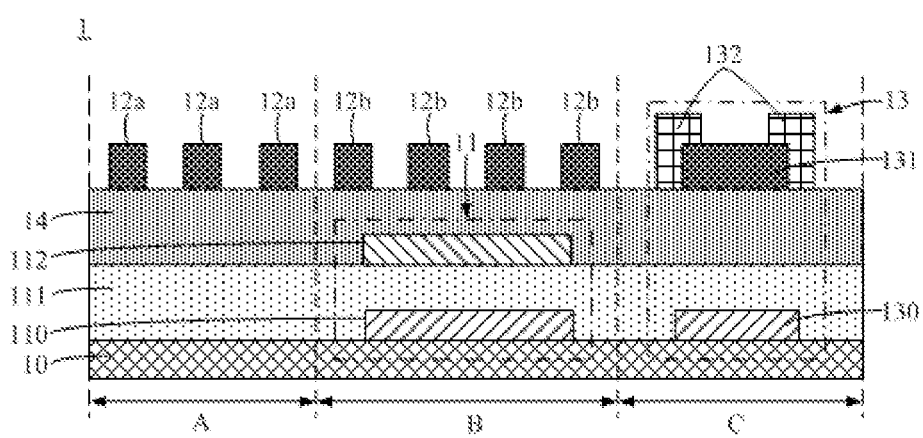
FIG. 3 shows a schematic cross-sectional view of a gate driving structure according to another embodiment of the present disclosure.

In order to solve the above technical problem, as shown in FIG. 2 and FIG. 3, an embodiment of the present disclosure provides a gate driving structure 1, which may be arranged in a non-display area of an array substrate. The gate driving structure 1 may include a base substrate 10, a shift register and a signal wiring group.

The base substrate 10 may be of a single-layer structure, for example, may be a glass substrate, but is not limited thereto. The base substrate 10 may also be of a multi-layer structure, that is, may include a glass substrate and a structure such as a buffer layer and the like formed on the glass substrate. It should be understood that the base substrate in the gate driving structure may be arranged in the same layer as that of a base substrate of a display structure in a display area of the array substrate. The arrangement in the same layer mentioned in the present disclosure refers to that structures are formed of the same material with an integrated-molding process. That is, the base substrate of the gate driving structure and the base substrate of the display structure may be integrally processed.

A plurality of shift registers may be provided, that is, the gate driving structure 1 may include a plurality of stages of shift registers. The shift register may be formed on the base substrate 10 of the gate driving structure 1, and may include a plurality of thin film transistors 13 and at least one capacitor 11 for storing charges.

Figure 5:
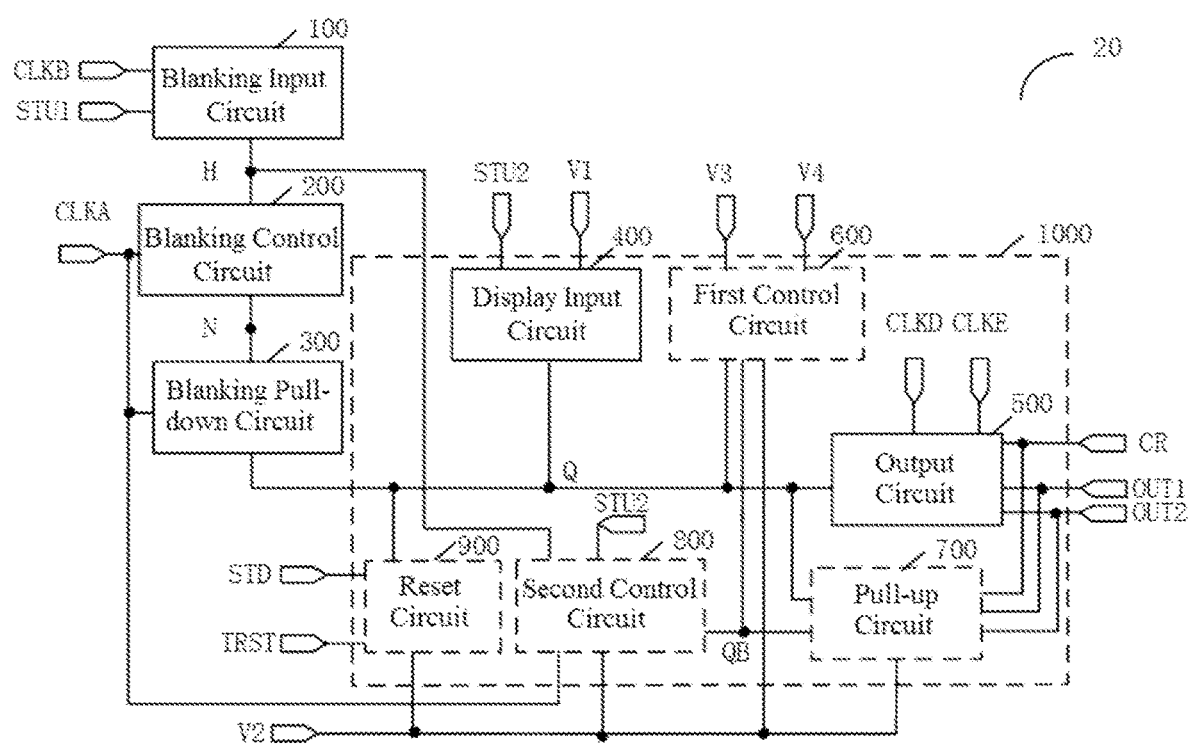
FIG. 5 shows a schematic block diagram of a shift register according to another embodiment of the present disclosure.

According to another embodiment of the present disclosure, as shown in FIG. 5, the shift register 20 may include a blanking input circuit 100, a blanking control circuit 200, a blanking pull-down circuit 300, and a shift register circuit 1000. In an embodiment, the shift register circuit 1000 may include a display input circuit 400 and an output circuit 500. In addition, in other embodiments, the shift register circuit 1000 may further include a first control circuit 600, a pull-up circuit 700, and a second control circuit 800. Further, in other embodiments, the shift register circuit 1000 may further include a reset circuit 900.

FIG. 5 shows an example in which the shift register circuit 1000 includes a display input circuit 400, an output circuit 500, a first control circuit 600, a pull-up circuit 700, a second control circuit 800, and a reset circuit 900. The blanking input circuit 100, the blanking control circuit 200, and the blanking pull-down circuit 300 have been described in detail above, and are not repeated here. The following mainly describes the respectively circuits in the shift register circuit 1000.

As shown in FIG. 5, the display input circuit 400 may provide a first voltage V1 from a first voltage terminal to the pull-down node Q according to a display input signal STU2 from the display input signal terminal to control a voltage of the pull-down node Q. For example, the display input circuit 400 may be coupled to the display input signal terminal to receive the display input signal STU2, and coupled to the first voltage terminal to receive the first voltage V1. In an embodiment, the first voltage terminal may provide a direct current low-level signal, that is, the first voltage V1 is at a low level.

The output circuit 500 may output a shift signal from the shift signal output terminal CR and a first drive signal from the first drive signal output terminal OUT1 according to the voltage of the pull-down node Q. For example, the output circuit 500 may be coupled to the fourth clock signal terminal to receive the fourth clock signal CLKD. The output circuit 500 may provide the fourth clock signal CLKD to the shift signal output terminal CR according to the voltage of the pull-down node Q, to output the fourth clock signal CLKD as the shift signal, and provide the fourth clock signal CLKD to the first drive signal output terminal OUT1, to output the fourth clock signal CLKD as the first drive signal.

In an embodiment, the output circuit 500 may also output a second drive signal from a second drive signal output terminal OUT2 according to the voltage of the pull-down node Q. For example, the output circuit 500 may be coupled to a fifth clock signal terminal to receive a fifth clock signal CLKE. In an embodiment, the output circuit 500 may further provide the fifth clock signal CLKE to the second drive signal output terminal OUT2 according to the voltage of the pull-down node Q, to output the fifth clock signal CLKE as the second drive signal. Those skilled in the art can understand that the number of drive signal output terminals is not limited to two, but may be more than two. The output circuit may output the respective drive signals according to the respective clock signals. In the embodiment, during the display period, the shift signal and the corresponding drive signal may also be collectively referred to as a display output signal. Moreover, during the blanking period, the shift signal and the corresponding drive signal may also be collectively referred to as a blanking output signal.

The first control circuit 600 may control the voltage of the pull-up node QB according to the voltage of the pull-down node Q. For example, the first control circuit 600 may be coupled to a second voltage terminal to receive a second voltage V2, and coupled to a third voltage terminal to receive a third voltage V3. In an embodiment, the second voltage terminal may provide a DC high-level signal, that is, the second voltage V2 is at a high level. The first control circuit 600 may control the voltage of the pull-up node QB according to the second voltage V2 and the third voltage V3, under the control of the voltage of the pull-down node Q.

Further, the first control circuit 600 may be coupled to a fourth voltage terminal to receive a fourth voltage V4. The third voltage terminal and the fourth voltage terminal may alternately provide a DC low-level signal. For example, one of the third voltage V3 and the fourth voltage V4 is at a low level, and the other is at a high level. In an embodiment, the first control circuit 600 may control the voltage of the pull-up node QB according to the second voltage V2 and the third voltage V3 (or the fourth voltage), under the control of the voltage of the pull-down node Q.

The pull-up circuit 700 may provide the second voltage V2 from the second voltage terminal to the pull-down node Q, the shift signal output terminal CR, the first drive signal output terminal OUT1 and the second drive signal output terminal OUT2 according to the voltage of the pull-up node QB. For example, the pull-up circuit 700 may be coupled to the second voltage terminal to receive the second voltage V2. Therefore, the pull-up circuit 700 pulls down the pull-down node Q, the shift signal output terminal CR, and the respective drive signal output terminal to reduce noise at each terminal.

The second control circuit 800 may control the voltage of the pull-up node QB according to the first clock signal CLKA and the voltage of the first control node H. For example, the second control circuit 800 may be coupled to the first clock signal terminal to receive the first clock signal CLKA, and coupled to the second voltage terminal to receive the second voltage. In an embodiment, the second control circuit 800 may provide the second voltage to the pull-up node QB under the control of the first clock signal CLKA and the voltage of the first control node H. In addition, the second control circuit 800 may control the voltage of the pull-up node QB according to a display input signal STU2. For example, the second control circuit 800 may be coupled to the display input signal terminal to receive the display input signal STU2. In an embodiment, the second control circuit 800 may provide the second voltage to the pull-up node QB under the control of the display input signal STU. Therefore, the second control circuit 800 may pull up the pull-up node QB.

In addition, the reset circuit 900 may reset the pull-down node Q according to a blanking reset signal TRST from a blanking reset signal terminal, and reset the pull-down node Q according to a display reset signal STD from a display reset signal terminal. For example, the reset circuit 900 may be coupled to the blanking reset signal terminal to receive the blanking reset signal TRST, coupled to the display reset signal terminal to receive the display reset signal STD, and coupled to the second voltage terminal to receive the second voltage V2. In an embodiment, the reset circuit 900 may provide the second voltage V2 to the pull-down node Q according to the blanking reset signal TRST, and provide the second voltage V2 to the pull-down node Q according to the display reset signal STD.

Those skilled in the art can understand that, while, as FIG. 5 shows, the shift register circuit 1000 comprises the display input circuit 400, the output circuit 500, the first control circuit 600, the pull-up circuit 700, the second control circuit 800, and the reset circuit 900, the above examples do not limit the protection scope of the present disclosure. In actual practice, a technician may choose to use or not use one or more of the above circuits according to the situation. Various combinations and modifications based on the foregoing circuits are not deviated from the principles of the present disclosure. The details can be omitted here.

The shift register provided by the embodiments of the present disclosure are described below with exemplary circuit structures.

Figure 6:
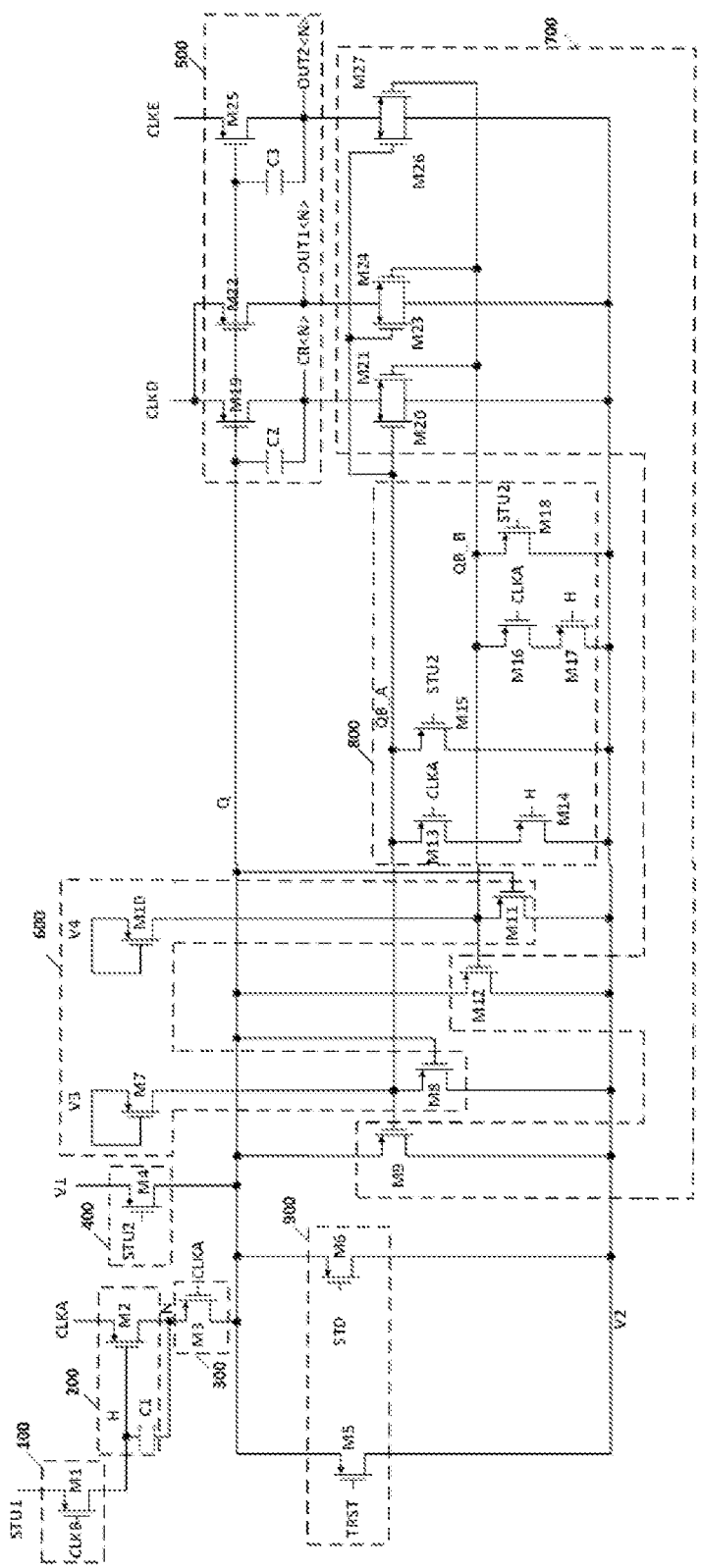
FIG. 6 shows an exemplary circuit diagram of a shift register according to another embodiment of the present disclosure.

FIG. 6 illustrates an exemplary circuit diagram of a shift register according to an embodiment of the present disclosure. The shift register is, for example, the shift register 20 shown in FIG. 5. As shown in FIG. 6, the shift register may include a first transistor M1 to a twenty-seventh transistor M27, and a first capacitor C1 to a third capacitor C3.

It should be noted that the transistors used in the embodiments of the present disclosure may be thin film transistors or field effect transistors or other switching devices with like characteristics. In the embodiments of the present disclosure, the thin film transistor is taken as an example for description. A source and a drain of the transistor herein can be symmetrical in structure, thus there can be no difference in structure of the source and the drain of the transistor. In an embodiment of the present disclosure, in order to distinguish the two electrodes of the transistor other than a gate, one electrode can be referred to as a first electrode and the other electrode can be referred to as a second electrode. The gate of the transistor can be referred to as a control electrode. In addition, the transistors can be classified into N-type and P-type transistors according to the characteristics of the transistors. If the transistor is a P-type transistor, an ON voltage is a low-level voltage, for example, 0V, −5V, −10V, or other suitable voltage, and an OFF voltage is a high-level voltage, for example, 5V, 10V, or other suitable voltage. If the transistor is an N-type transistor, an ON voltage is a high-level voltage, for example, 5V, 10V, or other suitable voltage, and an OFF voltage is a low-level voltage, for example, 0V, −5V, −10V, or other suitable voltage.

In addition, it should be noted that, in the embodiments of the present disclosure, the transistors in the shift register can be described by taking P-type transistors as an example. The embodiments of the present disclosure may also include, but are not limited to, for example, employing N-type transistors for at least part of the transistors in the shift register. In such cases, the potentials of the voltages, such as, the first voltage, the second voltage, or the like, may change correspondingly.

In an embodiment of the present disclosure, the pull-up node QB may include at least one of a first pull-up node QB_A and a second pull-up node QB_B. FIG. 6 shows a case where the pull-up node QB includes both the first pull-up node QB_A and the second pull-up node QB_B. It can be understood that the pull-up node QB may also include only one of the first pull-up node QB_A and the second pull-up node QB_B, and the associated circuits may only be adjusted accordingly.

As shown in FIG. 6, the blanking input circuit 100 includes a first transistor M1. A control electrode of the first transistor M1 is coupled to the second clock signal terminal to receive the second clock signal CLKB. A first electrode of the first transistor M1 is coupled to the blanking input signal terminal to receive the blanking input signal STU1. A second electrode of the first transistor M1 is coupled to the first control node H. In an embodiment, when the second clock signal CLKB is at a low level, the first transistor M1 is turned on, such that the blanking input signal can be provided to the first control node H to control the voltage of the first control node H.

The blanking control circuit 200 includes a second transistor M2 and a first capacitor C1. A control electrode of the second transistor M2 is coupled to the first control node H. A first electrode of the second transistor M2 is coupled to the first clock signal terminal to receive the first clock signal CLKA. A second electrode of the second transistor M2 is coupled to the second control node N. A first end of the first capacitor is coupled to the first control node H, and the second end of the first capacitor is coupled to the second control node N. In an embodiment, in a case that the voltage of the first control node H is at a low level, the second transistor M2 is turned on, and the first clock signal CLKA is provided to the second control node N to control the voltage of the second control node N. When the voltage of the second control node N changes, as the first capacitor C1 maintains the voltage difference between the first control node H and the second control node N, the voltage of the first control node H also changes accordingly.

The blanking pull-down circuit 300 includes a third transistor M3. A control electrode of the third transistor M3 is coupled to the first clock signal terminal to receive the first clock signal CLKA. A first electrode of the third transistor M3 is coupled to the second control node N. A second electrode of the third transistor M3 is coupled to the pull-down node Q. In an embodiment, in a case that the first clock signal CLKA is at a low level, the third transistor M3 is turned on, such that the voltage of the second control node N is provided to the pull-down node Q.

The display input circuit 400 includes a fourth transistor M4. A control electrode of the fourth transistor M4 is coupled to the display input signal terminal to receive the display input signal STU2. A first electrode of the fourth transistor M4 is coupled to the first voltage terminal to receive the first voltage V1. A second electrode of the fourth transistor M4 is coupled to the pull-down node Q. In an embodiment, in a case that the display input signal STU2 is at a low level, the fourth transistor M4 is turned on, to provide the first voltage V1 to the pull-down node Q, such that the voltage of the pull-down node Q is at a low level.

The output circuit 500 includes a nineteenth transistor M19, a twenty-second transistor M22, and a second capacitor C2. A control electrode of the nineteenth transistor M19 is coupled to the pull-down node Q. A first electrode of the nineteenth transistor M19 is coupled to a fourth clock signal terminal to receive a fourth clock signal CLKD. A second electrode of the nineteenth transistor M19 is coupled to the shift signal output terminal CR. A control electrode of the twenty-second transistor M22 is coupled to the pull-down node Q. A first electrode of the twenty-second transistor M22 is coupled to the fourth clock signal terminal to receive the fourth clock signal CLKD. A second electrode of the twenty-second transistor M22 is coupled to the first drive signal output terminal OUT1. A first end of the second capacitor C2 is coupled to the pull-down node Q, and the second end of the second capacitor C2 is coupled to the shift signal output terminal CR.

In addition, the output circuit 500 may further include a twenty-fifth transistor M25 and a third capacitor C3. A control electrode of the twenty-fifth transistor M25 is coupled to the pull-down node Q. A first electrode of the twenty-fifth transistor M25 is coupled to a fifth clock signal terminal to receive a fifth clock signal CLKE. A second electrode of the twenty-fifth transistor M25 is coupled to the second drive signal output terminal OUT2. A first end of the third capacitor C3 is coupled to the pull-down node Q, and a second end of the third capacitor C3 is coupled to the second drive signal output terminal OUT2.

In the embodiment, when the pull-down node Q is at a low level, the nineteenth transistor M19, the twenty-second transistor M22, and the twenty-fifth transistor M25 are turned on, to provide the fourth clock signal CLKD to the shift signal output terminal CR and the first drive signal output terminal OUT1, and to provide the fifth clock signal CLKE to the second drive signal output terminal OUT2.

The first control circuit 600 includes a seventh transistor M7, an eighth transistor M8, a tenth transistor M10, and an eleventh transistor M11. A control electrode and a first electrode of the seventh transistor M7 are coupled to a third voltage terminal to receive the third voltage V3. A second electrode of the seventh transistor M7 is coupled to the first pull-up node QB_A. A control electrode of the eighth transistor M8 is coupled to the pull-down node Q. A first electrode of the eighth transistor M8 is coupled to the first pull-up node QB_A. A second electrode of the eighth transistor M8 is coupled to the second voltage terminal to receive the second voltages V2. A control electrode and a first electrode of the tenth transistor M10 is coupled to a fourth voltage terminal V4. A second electrode of the tenth transistor M10 is coupled to the second pull-up node QB_B. A control electrode of the eleventh transistor M11 is coupled to the pull-down node Q. A first electrode of the eleventh transistor M11 is coupled to the second pull-up node QB_B. A second electrode of the eleventh transistor M11 is coupled to the second voltage terminal V2 to receive the second voltage V2.

It can be understood, in a case that the pull-up node QB includes only the first pull-up node QB_A (or the second pull-up node QB_B), the first control circuit 600 may include a seventh transistor M7 and an eighth transistor M8

(or a tenth transistor M10 and eleventh transistor M11). In this situation, the specific circuit structure is similar and will not be repeated here.

In an embodiment, the third voltage terminal V3 and the fourth voltage terminal V4 may be configured to alternately provide a low level voltage. That is, when the third voltage terminal V3 provides a high level voltage, the fourth voltage terminal V4 provides a low level voltage, and the tenth transistor M10 is turned on. When the third voltage terminal V3 provides a low level voltage, the fourth voltage terminal V4 provides a high level voltage, and the seventh transistor M7 is turned on. Therefore, only one of the seventh transistor M7 and the tenth transistor M10 is in an ON state. This can avoid performance drift caused by long-term conduction of transistor.

When the seventh transistor M7 is turned on, the first pull-up node QB_A can be charged via the third voltage V3. When the tenth transistor M10 is turned on, the second pull-up node QB_B can be charged via the fourth voltage V4. Therefore pulling The voltage of the first pull-up node QB_A or the second pull-up node QB_B can be controlled to a low level. When the voltage of the pull-down node Q is at a low level, the eighth transistor M8 and the eleventh transistor M11 are turned on. For example, in the design for the transistors, the seventh transistor M7 and the eighth transistor M8 may be configured (for example, by setting the size ratio, the threshold voltage, or the like, of the two transistors) such that when both M7 and M8 are turned on, the voltage of the first pull-up node QB_A can be pulled up to a high level, which can maintain the twentieth transistor M20, the twenty-third transistor M23, and the twenty-sixth transistor M26 in an OFF state. On the other hand, the tenth transistor M10 and the eleventh transistor M11 may be configured (for example, by setting the size ratio, the threshold voltage, or the like, of the two transistors) such that when both M10 and M11 are turned on, the voltage of the second pull-up node QB_B may be pulled up to a high level, which can maintain the twenty-first transistor M21, the twenty-fourth transistor M24, and the twenty-seventh transistor M27 in an OFF state.

As shown in FIG. 6, the pull-up circuit 700 includes a ninth transistor M9, a twentieth transistor M20, a twenty-third transistor M23, a twelfth transistor M12, a twenty-first transistor M21, a twenty-fourth transistor M24, a twenty-sixth transistor M26 and a twenty-seventh transistor M27.

A control electrode of the ninth transistor M9 is coupled to the first pull-up node QB_A, a first electrode of the ninth transistor M9 is coupled to the pull-down node Q, and a second electrode of the ninth transistor M9 is coupled to the second voltage terminal V2. A control electrode of the twentieth transistor M20 is coupled to the first pull-up node QB_A, a first electrode of the twentieth transistor M20 is coupled to the shift signal output terminal CR, and a second electrode of the twentieth transistor M20 is coupled to the second voltage terminal V2. A control electrode of the twenty-third transistor M23 is coupled to the first pull-up node QB_A, a first electrode of the twenty-third transistor M23 is coupled to the first drive signal output terminal OUT1, and a second electrode of the twenty-third transistor M23 is coupled to the second voltage terminal V2. A control electrode of the twenty-sixth transistor M26 is coupled to the first pull-up node QB_A, a first electrode of the twenty-sixth transistor is coupled to the second drive signal output terminal OUT2, and a second electrode of the twenty-sixth transistor is coupled to the second voltage terminals V2. In an embodiment, when the voltage of the first pull-up node QB_A is at a low level, the ninth transistor M9, the twentieth transistor M20, the twenty-third transistor M23, and the twenty-sixth transistor are turned on, such that the pull-down node Q, the shift signal output terminal CR, the first drive signal output terminal OUT1 and the second drive signal output terminal OUT2 are pulled up.

A control electrode of the twelfth transistor M12 is coupled to the second pull-up node QB_B, a first electrode of the twelfth transistor M12 is coupled to the pull-down node Q, and a second electrode of the twelfth transistor M12 is coupled to the second voltage terminal V2. A control electrode of the twenty-first transistor M21 is coupled to the second pull-up node QB_B, a first electrode of the twenty-first transistor M21 is coupled to the shift signal output terminal CR, and a second electrode of the twenty-first transistor M21 is coupled to the second voltage terminal V2. A control electrode of the twenty-fourth transistor M24 is coupled to the second pull-up node QB_B, a first electrode of the twenty-fourth transistor M24 is coupled to the first drive signal output terminal OUT1, and a second electrode of the twenty-fourth transistor M24 is coupled to the second voltage terminal V2. A control electrode of the twenty-seventh transistor M27 is coupled to the second pull-up node QB_B, a first electrode of the twenty-seventh transistor is coupled to the second drive signal output terminal OUT2, and a second electrode of the twenty-seventh transistor is coupled to the second voltage terminals V2. In an embodiment, when the voltage of the second pull-up node QB_B is at a low level, the twelfth transistor M12, the twenty-first transistor M21, the twenty-fourth transistor M24, and the twenty-seventh transistor M27 are turned on, such that the pull-down node Q, the shift signal output terminal CR, the first drive signal output terminal OUT1 and the second drive signal output terminal OUT2 are pulled up.

It can be understood that when the pull-up node QB only includes the first pull-up node QB_A (or the second pull-up node QB_B), the pull-up circuit 700 may include the ninth transistor M9, the twentieth transistor M20, the twenty-third transistor M23, and the twenty-sixth transistor (or, the twelfth transistor M12, the twenty-first transistor M21, the twenty-fourth transistor M24, and the twenty-seventh transistor M27). The specific circuit structure is the same and will not be repeated here.

As shown in FIG. 6, the second control circuit 800 may include a thirteenth transistor M13, a fourteenth transistor M14, a fifteenth transistor M15, a sixteenth transistor M16, a seventeenth transistor M17, and an eighteenth transistor M18.

A control electrode of the thirteenth transistor M13 is coupled to the first clock signal terminal to receive the first clock signal CLKA, and a first electrode of the thirteenth transistor M13 is coupled to the first pull-up node QB_A. A control electrode of the fourteenth transistor M14 is coupled to the first control node H, a first electrode of the fourteenth transistor M14 is coupled to a second electrode of the thirteenth transistor M13, and a second electrode of the fourteenth transistor M14 is coupled to the second voltage terminals V2. A control electrode of the fifteenth transistor M15 is coupled to the display input signal terminal to receive the display input signal STU2. A first electrode of the fifteenth transistor M15 is coupled to the first pull-up node QB_A, and a second electrode of the fifteenth transistor M15 is coupled to the second voltage terminal to receive the second voltage V2. In an embodiment, when the voltages of the first clock signal CLKA and the first control node H are both at a low level, the second voltage can be provided to the first pull-up node QB_A. In addition, when the display input signal STU2 is at a low level, the second voltage can be provided to the first pull-up node QB_A.

A control electrode of the sixteenth transistor M16 is coupled to the first clock signal terminal to receive the first clock signal CLKA, and a first electrode of the sixteenth transistor M16 is coupled to the second pull-up node QB_B. A control electrode of the seventeenth transistor M17 is coupled to the first control node H, a first electrode of the seventeenth transistor M17 is coupled to a second electrode of the sixteenth transistor M16, and a second electrode of the seventeenth transistor M17 is coupled to the second voltage terminal to receive the second voltage V2. A control electrode of the eighteenth transistor M18 is coupled to the display input signal terminal to receive the display input signal STU2. A first electrode of the eighteenth transistor M18 is coupled to the second pull-up node QB_B, and a second electrode of the eighteenth transistor M18 is coupled to the second voltage terminal to receive the second voltage V2. In an embodiment, when the voltages of the first clock signal CLKA and the first control node H are both at a low level, a second voltage can be provided to the second pull-up node QB_B. In addition, when the display input signal STU2 is at a low level, the second voltage can be provided to the second pull-up node QB_B.

It can be understood that when the pull-up node QB only includes the first pull-up node QB_A (or the second pull-up node QB_B), the pull-up circuit 700 may include the thirteenth transistor M13, the fourteenth transistor M14, and the fifteenth transistor M15 (or, the sixteenth transistor M16, the seventeenth transistor M17, and the eighteenth transistor M18). The specific circuit structure is the same and will not be repeated here.

In addition, as shown in FIG. 6, the reset circuit 900 may include a fifth transistor M5 and a sixth transistor M6. A control electrode of the fifth transistor M5 is coupled to the blanking reset signal terminal to receive the blanking reset signal TRST, a first electrode of the fifth transistor M5 is coupled to the pull-down node Q, and a second electrode of the fifth transistor M5 is coupled to the second voltage terminal to receive the second voltage V2. In an embodiment, when the blanking reset signal TRST is at a low level, the fifth transistor M5 is turned on, such that the second voltage V2 can be provided to the pull-down node Q. A control electrode of the sixth transistor M6 is coupled to the display reset signal terminal to receive the display reset signal STD. A first electrode of the sixth transistor M6 is coupled to the pull-down node Q. A second electrode of the sixth transistor M6 is coupled to the second voltage terminal V2. In an embodiment, when the display reset signal STD is at a low level, the sixth transistor M6 is turned on, such that the second voltage V2 can be provided to the pull-down node Q.

Although the specific structure of the shift register is described above with reference to FIG. 6, the present disclosure is not limited thereto. For example, according to an exemplary embodiment of the present disclosure, the output circuit 500 in FIG. 6 may be replaced by a structure including transistors T1, T2, T3 and capacitors C1 and C2 in FIG. 7, and a part of the pull-up circuit 700 in FIG. 6, that is, the part including the transistors M20, M21, M23, M24, M26, and M27 may be replaced by a structure including transistors T4, T7, T5, T8, T6, and T9 in FIG. 7.

Figure 7:
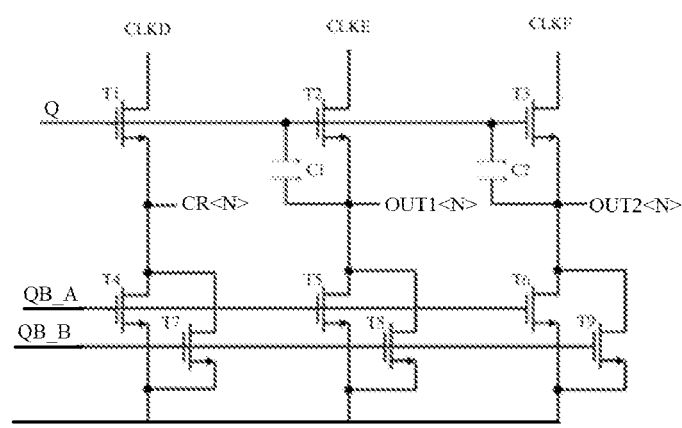
FIG. 7 shows an alternative circuit of a part of the shift register shown in FIG. 6.
Figure 8:
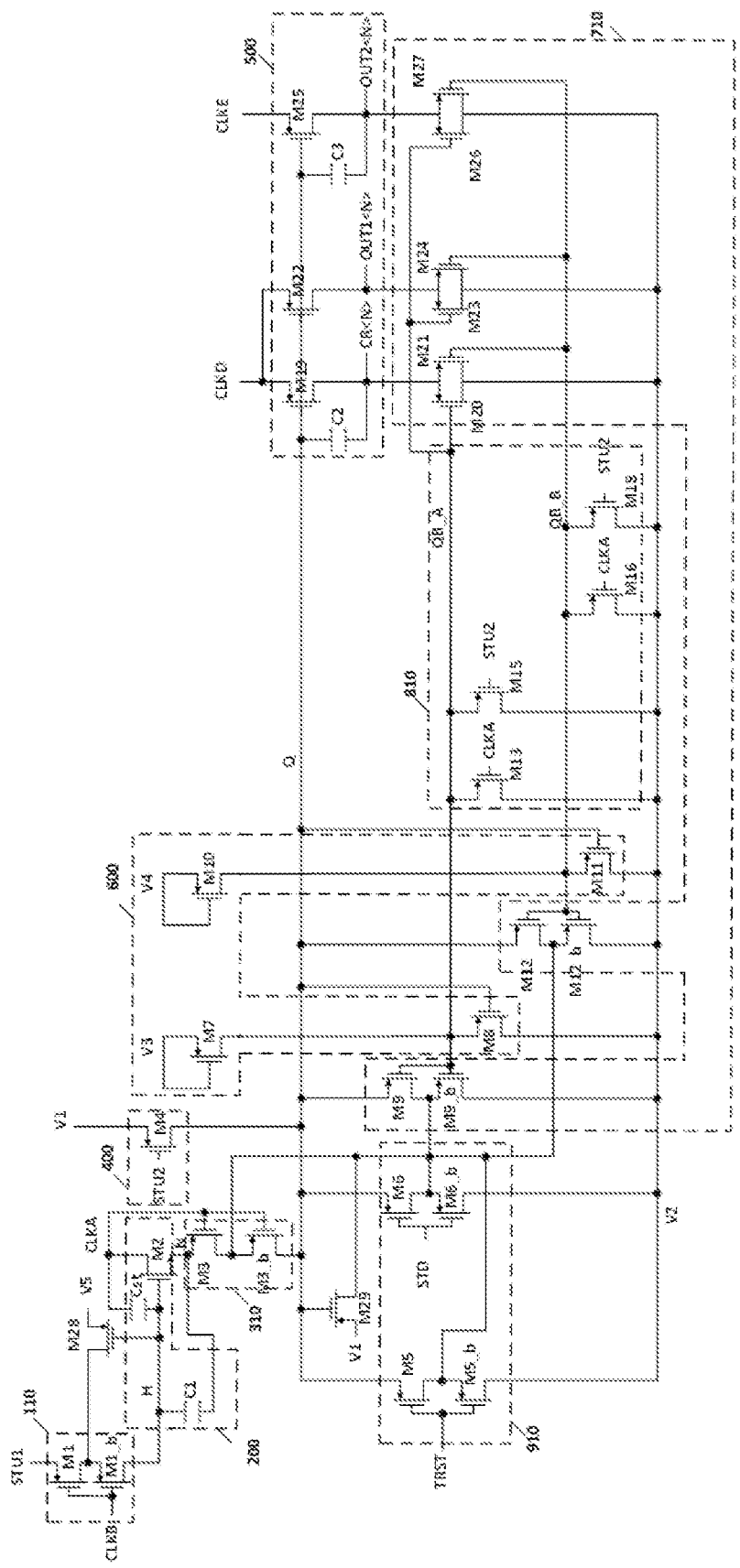
FIG. 8 shows an exemplary circuit diagram of a shift register according to yet another embodiment of the present disclosure.

FIG. 8 shows an exemplary circuit diagram of a shift register according to another embodiment of the present disclosure. The difference between the shift register shown in FIG. 8 and the shift register in FIG. 7 is that the second control circuit 800 is replaced with the second control circuit 810, and a first leakage-preventive transistor M1_b, a third leakage-preventive transistor M3_b, a fifth leakage-preventive transistor M5_b, a sixth leakage-preventive transistor M6_b, a ninth leakage-preventive transistor M9_b, a twelfth leakage-preventive transistor M12_b, a twenty-eighth transistor M28, and a twenty-ninth transistor M29 are added. Working principle of leakage prevention will be described below using the first leakage-preventive transistor M1_b as an example.

A control electrode of the first leakage-preventive transistor M1_b is coupled to the second clock signal terminal CLKB, a first electrode of the first leakage-preventive transistor M1_b is coupled to a second electrode of the twenty-eighth transistor M28, and a second electrode of the first leakage-preventive transistor M1_b is coupled to the first control node H. A control electrode of the twenty-eighth transistor M28 is coupled to the first control node H, and a first electrode of the twenty-eighth transistor M28 is coupled to the fifth voltage terminal V5 to receive a fifth voltage at a low level. When the first control node H is at a low level, the twenty-eighth transistor M28 is turned on under the control of the voltage of the first control node H. Therefore, a low-level signal from the fifth voltage terminal V5 can be input to the first electrode of the leakage-preventive transistor M1_b, such that both the first electrode and the second electrode of the first leakage-preventive transistor M1_b are in a low-level state, preventing the charge at the first control node H from leaking through the first leakage-preventive transistor M1_b. In this case, since the control electrode of the first leakage-preventive transistor M1_b and the control electrode of the first transistor M1 are coupled, the combination of the first transistor M1 and the first leakage-preventive transistor M1_b can achieve the same function as the first transistor M1 discussed above, while it can also preventing leakage of charge.

Similarly, the third leakage-preventive transistor M3_b, the fifth leakage-preventive transistor M5_b, the sixth leakage-preventive transistor M6_b, the ninth leakage-preventive transistor M9_b, and the twelfth leakage-preventive transistor M12_b can be combined, respectively, with the twenty-ninth transistor M29 to achieve leakage prevention structure, thereby preventing leakage of charge at the pull-down node Q. The working principle of preventing charge leakage of the pull-down node Q is the same as the above-mentioned working principle of preventing charge leakage of the first control node H. Details can be omitted herein.

Figure 9:
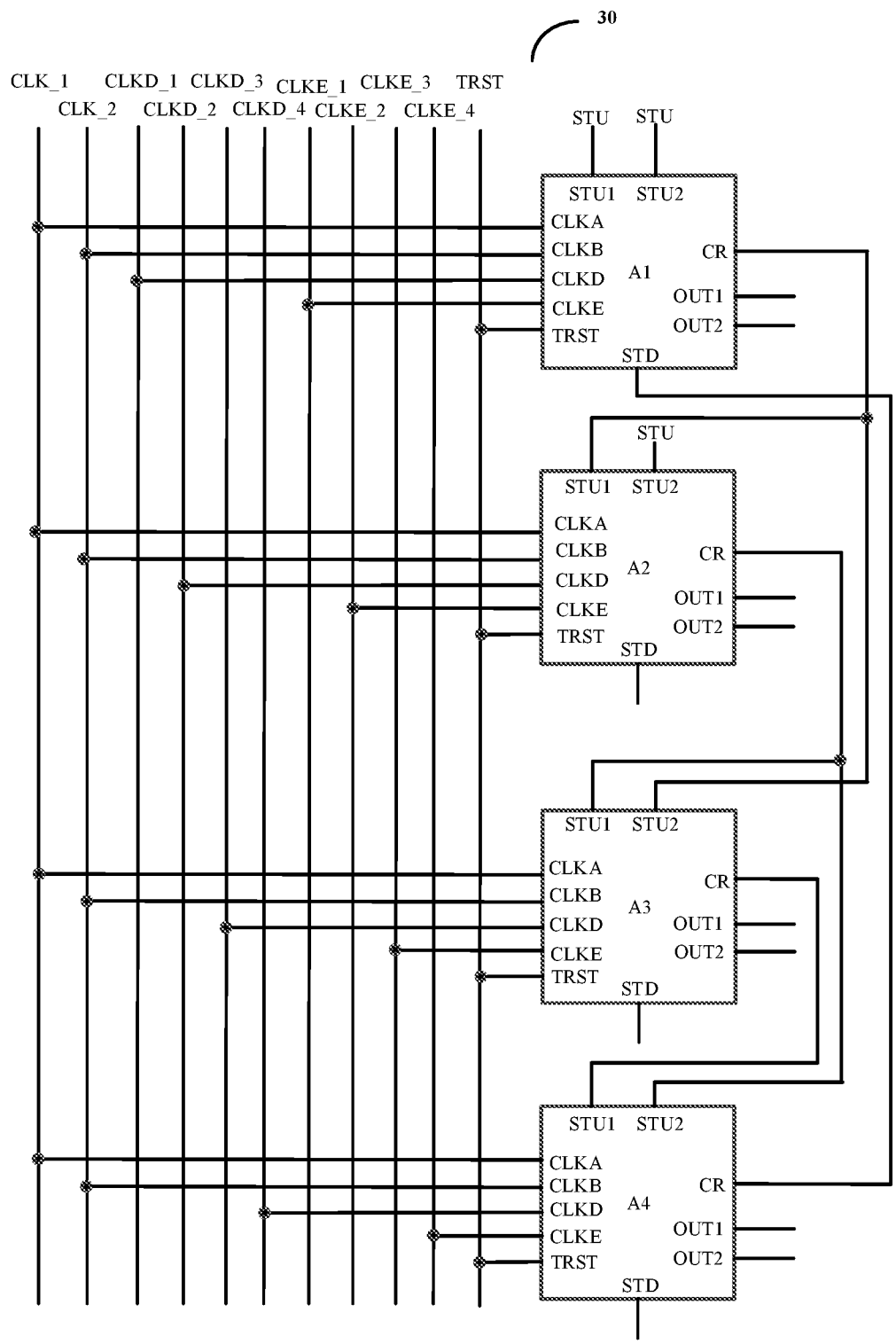
FIG. 9 shows a schematic diagram of a gate driving circuit according to an embodiment of the present disclosure.

The working process of the gate driving circuit 30 shown in FIG. 9 are described below with reference to the schematic signal timing diagram in FIG. 10. The shift register in the gate driving circuit 30 can be, for example, the shift register shown in FIG. 6.

Figure 10:
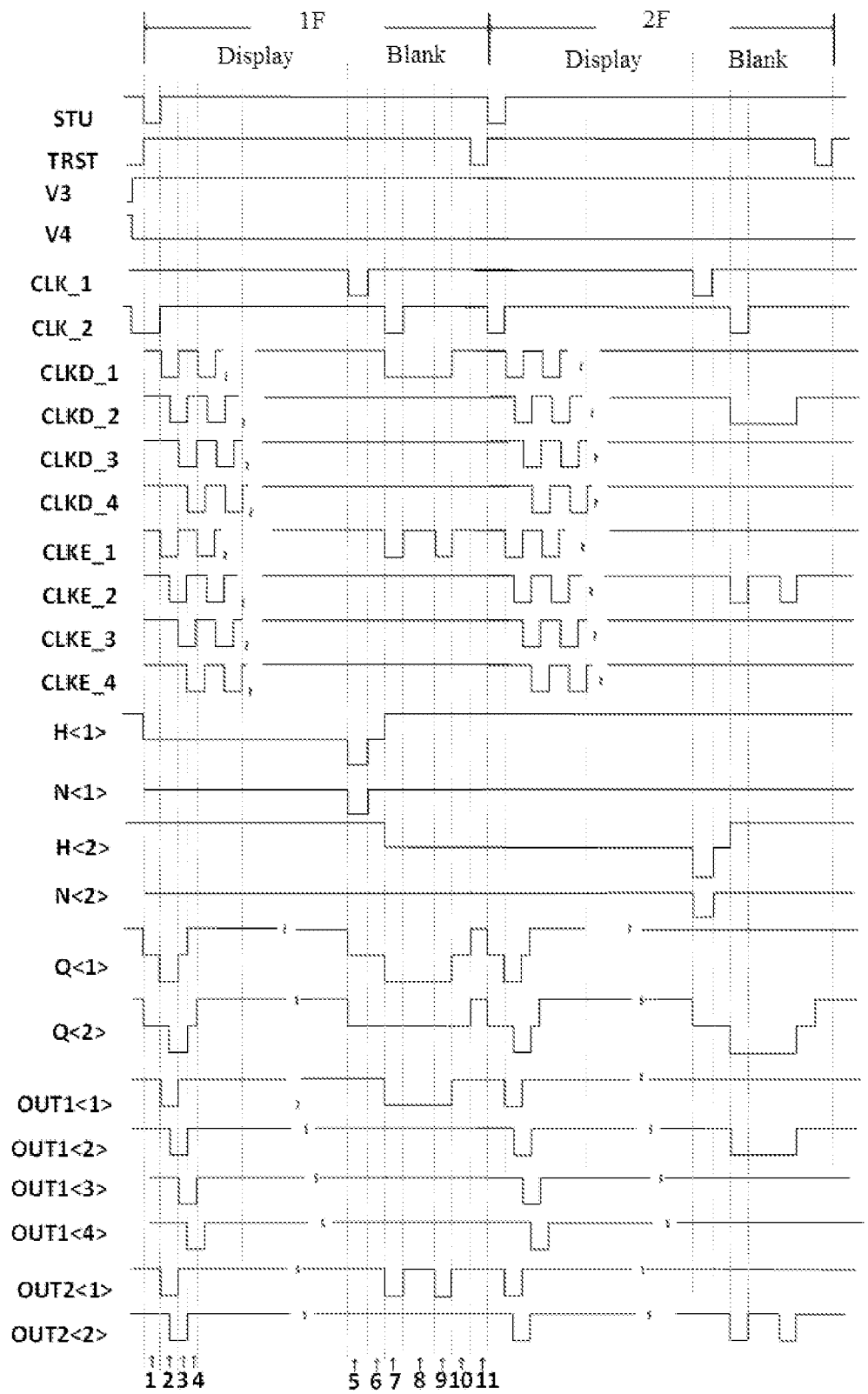
FIG. 10 shows a timing chart of signals during an operation of a gate driving circuit according to an embodiment of the present disclosure.

FIG. 10 shows a schematic diagram for illustrating signal timing sequence for the gate driving circuit 30 shown in FIG. 9 for sequential compensation. In FIG. 9, 1F and 2F indicate the first frame and the second frame, respectively. Display indicates the display period in a frame, and Blank indicates the blanking period in a frame.

The signal STU represents the input signal STU. TRST indicates a signal provided to the blanking reset signal line TRST. The signals V3 and V4 represent signals provided to the third voltage terminal and the fourth voltage terminal of the shift register in the gate driving circuit 30, respectively. The signals CLK_1 and CLK_2 represent signals provided to the first sub-clock signal line CLK_1 and the second sub-clock signal line CLK_2, respectively. The signals CLKD_1, CLKD_2, CLKD_3, and CLKD_4 respectively represent signals provided to the third sub-clock signal line CLKD_1, the fourth sub-clock signal line CLKD_2, the fifth sub-clock signal line CLKD_3, and the sixth sub-clock signal line CLKD_4. The signals CLKE_1, CLKE_2, CLKE_3, and CLKE_4 respectively represent signals provided to the seventh sub-clock signal line CLKE_1, the eighth sub-clock signal line CLKE_2, the ninth sub-clock signal line CLKE_3 and the tenth sub-clock signal line CLKE_4.

H <1> and H <2> represent the voltages of the first control nodes H in the first-stage shift register A1 and the second-stage shift register A2 in the gate driving circuit 30, respectively. N <1> and N <2> represent the voltages of the second control nodes N in the first-stage shift register A1 and the second-stage shift register A2, respectively. Q <1> and Q <2> represent the voltages of the pull-down nodes Q in the first-stage shift register A1 and the second-stage shift register A2 in the gate driving circuit 30, respectively. OUT1 <1>, OUT1 <2>, OUT1 <3>, and OUT1 <4> represent the first drive signal output terminals OUT1 of the first-stage shift register A1, the second-stage shift register A2, the third-stage shift register A3 and the fourth-stage shift register A4 in the gate driving circuit 30, respectively. OUT2 <1> and OUT2 <2> represent the second drive signal output terminals OUT2 of the first-stage shift register A1 and the second-stage shift register A2 in the gate driving circuit 30, respectively. It can be noted that as the voltages of the shift signal output terminal CR and the drive signal output terminal OUT1 in each of the shift registers are the same, the shift signal output terminal CR is not shown in FIG. 10.

It can be noted that the voltage level of the signals in the signal timing diagram shown in FIG. 10 are only schematic and do not represent the real values of the voltage level.

The working principle of the gate driving circuit 30 shown in FIG. 9 can be described below in conjunction with the signal timing diagram in FIG. 10, in which the gate driving circuit 30 is configured for line-by-line sequential compensation. For example, the shift register in the gate driving circuit 30 in FIG. 9 may be implemented with the shift register shown in FIG. 6.

Before the start of the first frame 1F, the blanking reset signal line TRST and the second sub-clock signal line CLK_2 both provide a low level voltage, to provide the blanking reset signal terminal TRST and the second clock signal terminal CLKB of the shift registers at each stage. Therefore, the first transistor M1 and the fifth transistor M5 in each of the shift registers can be turned on. The blanking input signal STU1 (i.e., the input signal STU at a high level) is provided to the first control node H, such that the voltage of the first control node H is at a high level. The second voltage V2 (at a high level) is provided to the pull-down node Q, such that the voltage of the pull-down node Q is at a high level. As a result, the first control node H and the pull-down node Q at each stage are reset, implementing a global reset.

Then, the first frame 1F starts, the third voltage V3 is at a high level, and the fourth voltage V4 is at a low level. The signal provided by the blanking reset signal line TRST changes to high level, thus the fifth transistor M5 is turned off.

In the display period Display of the first frame 1F, the working process of the shift register at the first stage A1 is described as follows.

In the first period (1), the blanking input signal terminal STU1 and the display input signal terminal STU2 of the first-stage shift register are both coupled to the input signal line STU, such that the blanking input signal terminal STU1 and the display input signal terminal STU2 both provide low level signals. The second clock signal terminal CLKB provides a low-level signal, such that the first transistor M1 is turned on, thereby providing the blanking input signal STU1 to the first control node H <1>. In this case, the voltage of the first control node H <1> is at a low level, the first clock signal CLKA (coupled to the first sub-clock signal line CLK_1) is at a high level. Thus, the second transistor M2 is turned on, to provide the first clock signal CLKA to the second control node N <1>, such that the voltage of the second control node N <1> is at a high level. In addition, because the first clock signal CLKA is at a high level, the third transistor M3 is turned off, to isolate the first control node H <1> and the second control node N <1> from the pull-down node Q <1>. The first capacitor C1 maintains the voltage difference between the first control node H <1> and the second control node N <1> until the blanking period.

On the other hand, the fourth voltage V4 is at a low level. Thus the tenth transistor M10 is turned on to control the voltage of the control electrode of the twelfth transistor M12 to be a low level. Therefore, the twelfth transistor M12 is turned on, to provide the second voltage V2 to the pull-down node Q <1>, such that the voltage of the pull-down node Q <1> is at a high level. Because the display input signal STU2 is at a low level in the first period, the fourth transistor M4 is turned on, to provide the first voltage V1 to the pull-down node Q <1>, such that the voltage of the pull-down node Q <1> is at a low level. Therefore, the eighth transistor M8 and the eleventh transistor M11 are turned on, such that the first pull-up node QB_A and the second pull-up node QB_B are pulled high. Further, the pull-down node Q <1> is at a low level, such that the nineteenth transistor M19, the twenty-second transistor M22, and the twenty-fifth transistor M25 are turned on, to provide, respectively, the fourth clock signal CLKD (coupled to the third sub-clock signal line CLKD_1) and the fifth clock signal CLKE (coupled to the seventh sub-clock signal line CLKE_1) to the shift signal output terminal CR <1>, the first drive signal output terminal OUT1 <1>, and the second drive signal output terminals OUT2 <1>, thereby outputting high-level signals respectively.

Moreover, as the display input signal STU2 is at a low level, the fifteenth transistor M15 and the eighteenth transistor M18 are turned on, to provide the second voltage V2 at a high-level to the first pull-up node QB_A and the second pull-up node, respectively QB_B. Therefore, the first pull-up node QB_A and the second pull-up node QB_B can be pulled-up accordingly.

In the second period (2), a low-level signal can be provided to the fourth clock signal terminal CLKD via the third sub-clock signal line CLKD_1. A low-level signal can be provided to the fifth clock signal terminal CLKE via the seventh sub-clock signal line CLKE_1. The voltage of the pull-down node Q <1> can be further pulled down due to the bootstrap effect for the second capacitor C2. The nineteenth transistor M19, the twenty-second transistor M22, and the twenty-fifth transistor M25 are maintained in an ON state, such that the shift signal output terminal CR <1>, the first drive signal output terminal OUT1 <1>, and the second drive signal output terminal OUT2 <1> output low-level signals respectively. For example, the low-level signal from the shift signal output terminal can be configured for scanning shift of the upper to lower shift registers. Therefore, the low-level signal from the two drive signal output terminals can be configured to drive the sub-pixels in the display panel for display.

In the third period (3), the pull-down node Q <1> remains at low. Therefore, the nineteenth transistor M19, the twenty-second transistor M22, and the twenty-fifth transistor M25 remain in the ON state. A high-level signal is provided to the fourth clock signal terminal CLKD via the third sub-clock signal line CLKD_1. Moreover, a high-level signal is provided to the fifth clock signal terminal CLKE via the seventh sub-clock signal line CLKE_1. Therefore, the shift signal output terminals CR, the first drive signal output terminal OUT1, and the second drive signal output terminal OUT2 output high-level signals respectively. Because the shift signal output terminal CR <1>, the first drive signal output terminal OUT1 <1>, and the second drive signal output terminal OUT2 <1> are reset to a high level, the voltage of the pull-down node Q <1> may rise by a magnitude due to the coupling effect between the transistors. Moreover, as the display reset signal terminal STD of the first stage shift register A1 is coupled to the shift signal output terminal CR <4> (i.e., OUT1 <4>) of the fourth stage shift register A4, and the shift signal output terminal CR <4> of the fourth stage shift register A4 has not yet output a low-level signal, thus the pull-down node Q <1> may not be pulled up. Therefore, the pull-down node Q <1> can be maintained at a lower level.

In the fourth period (4), the shift signal output terminal CR <4> of the fourth-stage shift register A4 outputs a low-level signal, to provide a low-level signal to the display reset signal terminal STD of the first-stage shift register A1. In this case, the sixth transistor M6 is turned on, and the voltage of the pull-down node Q <1> becomes a high level. That is, the pull-down node Q <1> can be reset. Further, as the voltage of the pull-down node Q <1> is at a high level, the eleventh transistor M11 is turned off, and the voltage of the second pull-up node QB_B is pulled down to a low level via the tenth transistor M10. Hence, the twelfth transistor M12 is turned on, to eliminate the noise of the pull-down node Q <1>. In addition, the twenty-first transistor M21, the twenty-fourth transistor M24, and the twenty-seventh transistor M27 are turned on to provide the second voltage V2 to the shift signal output terminal CR <1>, the first drive signal output terminal OUT1 <1>, and the second drive signal output terminal OUT2 <1>, thereby outputting high-level signals, respectively.

In the display period of the first frame described above, as the first clock signal CLKA has been maintained at a low level, the third transistor M3 is turned off. The third transistor M3 can isolate the influence of the voltage at the first control node H <1> and the second control node N <1> on the pull-down node Q <1> in the display period.

After the shift register at the first stage drives the sub-pixels in the first row of the display panel to display, the shift registers at the second stage, the third stage, and the like, may drive the sub-pixels in the display panel row by row for the display drive of one frame. Then, the display period of the first frame ends.

At the beginning of the display period (Display), the first control node H <1> is written as a low level and is maintained until the blanking period (Blank). The second transistor is turned on, while the first clock signal CLKA is at a high level, therefore, the second control node N <1> is written as a high level and is maintained until the blanking period (Blank).

In the blanking period (Blank) of the first frame 1F, the working process of the shift register at the first stage A1 is described as follows.

In the fifth period (5), the first sub-clock signal line CLK_1 provides a low-level signal to the first clock signal CLKA, the first control node H <1> is maintained as low level, and the second transistor M2 is turned on. The first clock signal CLKA is provided to the second control node N <1>, such that the voltage of the second control node N <1> changes to a low level. As the first capacitor C1 maintains the voltage difference between the first control node H <1> and the second control node N <1>, the voltage of the first control node H <1> is correspondingly reduced. Therefore, the first clock signal CLKA is provided to the second control node N <1> without loss, such that the voltage of the second control node N <1> can reach the lowest potential of the first clock signal CLKA, thereby achieving lossless outputting. Moreover, the third transistor M3 is turned on, to provide the voltage of the second control node N <1> (the lossless first clock signal CLKA) to the pull-down node Q <1>, such that the voltage of the pull-down node Q <1> changes to a low level. During this period, the fourth clock signal CLKD and the fifth clock signal terminal CLKE are both high-level signals, such that the shift signal output terminal CR, the first drive signal output terminal OUT1, and the second drive signal output terminal OUT2 output high level signal, respectively.

In the sixth period (6), the first sub-clock signal line CLK_1 provides a high-level signal to the first clock signal CLKA. The voltage of the second control node N <1> changes to a high level. The voltage difference held by the first capacitor C1 causes the voltage of the first control node H <1> to rise accordingly.

In the seventh period (7), the second sub-clock signal line CLK_2 provides a low-level signal to the second clock signal CLKB. The first transistor M1 is turned on, to provide the blanking input signal STU1 at a high-level to the first control node H <1>, to pull the corresponding voltage up to a high level. The second transistor M2 is turned off, and the voltage of the second control node N <1> is held unchanged.

The third transistor M3 is turned off. The fourth clock signal CLKD and the fifth clock signal CLKE are low-level signals. The shift signal output terminal CR <1>, the first drive signal output terminal OUT1 <1>, and the second drive signal output terminal OUT2 <1> output low-level signal, respectively. With the function of the second capacitor C2 and the third capacitor C3, the voltage of the pull-down node Q <1> can be further pulled down.

Moreover, because the second clock signal CLKB is at a low level, the first transistor M1 in the shift register at the second stage A2 is turned on. The blanking input signal STU1 <2> of the shift register at the second stage A2 is coupled to the shift signal output terminal CR <1> of the shift register at the first stage A1. Therefore, the voltage of the first control node H <2> in the second-stage shift register A2 is reduced to a low level.

In the eighth period (8), the second sub-clock signal line CLK_2 provides a high-level signal to the second clock signal CLKB. The third sub-clock line CLKD_1 provides a low-level signal to the fourth clock signal terminal CLKD. The seventh sub-clock signal line CLKE_1 provides a high-level signal to the fifth clock signal terminal CLKE. In this case, the shift signal output terminal CR <1>, the first drive signal output terminal OUT1 <1> outputs a low-level signal, while the second drive signal output terminal OUT2 <1> outputs a high-level signal. The first transistor M1 in the second-stage shift register A2 is turned off. The first control node H <2> remains at a low level until the blanking period BLANK for the next frame.

In the ninth period (9), the second clock signal CLKB remains at a high level. The fourth clock signal CLKD and the fifth clock signal CLKE are both at a low level. The shift signal output terminal CR <1>, the first drive signal output terminal OUT1 <1>, and the second drive signal output terminal OUT2 <1> output low-level signal, respectively.

From the above, during the 7-9th period of the blanking period, the first drive signal output terminal OUT1 <1> outputs the first drive signal at low-level, to drive the sensing transistor (for example, P Type transistor). Therefore, the sensing transistors in the first row of sub-pixels can sense the driving current of the sub-pixels in the row, thereby compensating based on the sensed driving current.

In the tenth period (10), both the fourth clock signal CLKD and the fifth clock signal CLKE become high level. The shift signal output terminal CR <1>, the first drive signal output terminal OUT1 <1>, and the second drive signal output terminal OUT2 <1> output a high-level signal, respectively. Under the control of the second capacitor C2 and the third capacitor C3, the voltage of the pull-down node Q rises.

In the eleventh period (11), the blanking reset signal line TRST provides a low-level signal to the blanking reset signal terminal TRST. The fifth transistor M5 is turned on. The voltage of the pull-down node Q is at a high level. The fourth voltage is at a low level. The tenth transistor M10 is turned on, such that the voltage of the second pull-up node QB_B is at a low level. Accordingly, the twenty-first transistor M21, the twenty-fourth transistor M24, and the twenty-seventh transistor M27 are all turned on. Therefore, the shift signal output terminal CR <1>, the first drive signal output terminal OUT1 <1>, and the second drive signal output terminal OUT2 <1> respectively output high-level signals.

Then, a process for driving the gate driving circuit in more time periods such as a second frame 2F, a third frame 3F, or the like can be implemented with reference to the foregoing description. Details will not be described herein again.

In an embodiment of the present disclosure, the capacitor may be coupled to the thin film transistor. It should be understood that the thin film transistor coupled to the capacitor is a thin film transistor of the output module in the shift register. For example, as shown in FIG. 7, the capacitor C1 may be coupled to the thin film transistor T2, and the capacitor C2 may be coupled to the thin film transistor T3.

In detail, as shown in FIGS. 2 and 3, the thin film transistor 13 may include a gate layer 130, an active layer 131, and a source and drain layer 132 sequentially formed on the base substrate 10. It should be understood that the active layer 131 is not limited to being arranged on a side of the gate layer 130 away from the base substrate 10, but may also be arranged on a side of the gate layer 130 facing the base substrate 10. Further, insulating layers may be respectively disposed between the active layer 131 and the gate layer 130 and between the gate layer 130 and the source and drain layer 132. The capacitor 11 may include a first electrode layer 110, a first insulating layer 111, and a second electrode layer 112 sequentially formed on the base substrate 10. The first electrode layer 110 and the gate layer 130 of the thin film transistor 13 may be arranged in the same layer and coupled to each other, and the second electrode layer 112 and a gate layer of a sub-pixel unit in the display area may be arranged in the same layer and coupled to each other.

The second electrode layer 112 may be coupled to the gate layer of the sub-pixel unit through an output line. That is, the shift register may include the output line (not shown), and the output line may be arranged in the same layer with the second electrode layer 112 with one end coupled to the second electrode layer 112 and the other end extending to a position where the display area is located and coupled to the gate layer of the sub-pixel unit. The output line may be coupled to the output terminals OUT<N>/OUT<N> in FIGS. 5 to 8. For example, a width of the output line is smaller than that of the second electrode layer 112, so that a space occupied by the output line may be reduced and other structures may be easily arranged.

The signal wiring group may be formed on the base substrate 10 of the gate driving structure 1. The signal wiring group may include a plurality of signal wirings spaced apart from each other, and the signal wiring group may be in the same layer with the source and drain layer 132 of the thin film transistor 13 and coupled to the same. That is, the signal wiring may be arranged on a side of the second electrode layer 112 of the capacitor 11 away from the base substrate 10. A second insulating layer 14 may be arranged between the signal wiring and the second electrode layer 112 of the capacitor 11.

It should be understood that when the gate driving structure 1 is arranged at a side of the display area in a row direction, the plurality of signal wirings may be space apart from each other in the row direction, and may extend in a column direction. The signal wiring may be coupled to the thin film transistor 13 to transmit a signal to the thin film transistor 13.

In addition, it should also be understood that the gate driving structure 1 may further include an intermediate wiring (not shown) in order to couple the signal wiring to the thin film transistor 13 in the shift register. The intermediate wiring extends in the row direction to couple the signal wiring to the thin film transistor 13. The signal wiring may be arranged in the same layer as or in different layers from the intermediate wiring, which depends on a specific condition.

Figure 4:
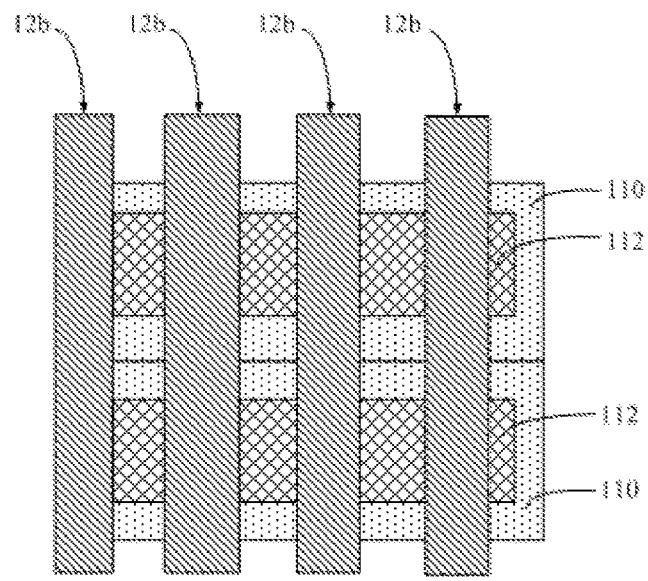
FIG. 4 shows a schematic diagram of an arrangement of some signal wirings and capacitors in a gate driving structure according to an embodiment of the present disclosure.

In an embodiment, as shown in FIGS. 2 to 4, an orthographic projection of the capacitor 11 in the shift register on the base substrate 10 is at least partially overlapped with an orthographic projection of the signal wiring group on the base substrate 10, that is, at least part of the capacitor 11 is arranged in the area where the signal wiring group is located. It should be noted that since the signal wiring group usually occupies a relatively large area, preferably, the entire capacitor 11 is arranged in the area where the signal wiring group is located. Since at least part of the capacitor 11 is arranged in the area where the signal wiring group is located, that is, the area where a part of the structure of the shift register is located is overlapped with the area where the signal wiring group is located, therefore, compared to the technical solution in which the shift register and the signal wiring group are arranged in different areas of the base substrate 10, the present solution makes a storage capacitance of the capacitor 11 large enough while greatly reducing a space occupied by the gate driving structure 1, thereby saving the area of the non-display area, which is beneficial to a narrow bezel design.

In addition, it should be understood that although at least part of the capacitor 11 is arranged in the area where the signal wiring group is located in the embodiment, the capacitor 11 substantially does not affect a signal transmission of the signal wiring.

In detail, the plurality of signal wirings in the signal wiring group may include a plurality of first signal wirings 12a and a plurality of second signal wirings 12b. The first signal wiring 12a and the second signal wiring 12b are configured to transmit different signals. In such case, the base substrate 10 of the gate driving structure 1 may have a first area A and a second area B. The plurality of first signal wirings 12a are formed at intervals in the first area A, and the plurality of second signal wirings 12b are formed at intervals in the second area B.

It should be understood that when the gate driving structure 1 is located on the side of the display area in the row direction, the first area and the second area are arranged in the row direction, and the second area may be arranged in a side of the first area close to the display area.

In an embodiment, in order to reduce a voltage drop, the capacitor 11 may be arranged to be close to the display area. Therefore, the capacitor 11 may be formed in the second area B and arranged at the side of the second signal wiring 12b facing the base substrate 10.

The base substrate 10 may not only have the first area A and the second area B, but also a third area C. Each of the thin film transistors 13 in the shift register may be formed in the third area C. The third area C and the first area A and the second area B are arranged in the row direction. That is, in an embodiment, the orthographic projection of each of the thin film transistors 13 in the shift register on the base substrate 10 is not overlapped with the orthographic projections of the signal wiring group, the capacitor 11 in the shift register on the base substrate 10, so that manufacturing difficulty of the gate driving structure 1 may be reduced.

For example, as shown in FIG. 2, the third area C may be arranged between the first area A and the second area B. That is, the thin film transistor 13 in the shift register is arranged farther away from the display area than the capacitor 11 in the shift register. Such design, on the one hand, may reduce a voltage drop, and on the other hand, may reduce light emitted from the display area irradiating on the thin film transistor 13 in the shift register, thereby preventing the performance of the thin film transistor 13 from being affected due to the thin film transistor 13 being exposed to the light.

It should be understood that the third area C is not limited to being arranged between the first area A and the second area B. As shown in FIG. 3, the third area C may be arranged at a side of the second area B close to the display area. That is, the thin film transistor 13 in the shift register is arranged closer to the display area than the capacitor 11 in the shift register, so that the first area A and the second area B may be arranged adjacently, which facilitates the processing and shaping of the signal wiring group, and reduces the processing difficulty of the gate driving structure 1.

In an embodiment, the first signal wiring 12a in the signal wiring group is a clock signal wiring, and the second signal wiring 12b is a DC signal wiring. However, the present disclosure is not limited thereto, for example, the first signal wiring 12a may be a DC signal wiring, and the second signal wiring 12b may be a clock signal wiring.

In an embodiment of the present disclosure, as shown in FIG. 5, the clock signal wiring may be coupled to the clock signal input terminals CLKD, CLKE, and CLKF of the shift register shown in FIG. 5 through an intermediate wiring; and the DC signal wiring may be coupled to the DC signal terminals VGL1, VGL2, and VGL3 of the shift register shown in FIG. 5 through the intermediate wiring. The clock signal output by the clock signal wiring may be a high frequency signal, and the clock signal output by the DC signal wiring may be a low frequency signal, which however is not limited thereto and depends on a specific condition. In addition, the DC signal wiring includes not only the DC signal wiring coupled to the DC signal terminals VGL1, VGL2, VGL3, but also the DC signal wiring coupled to the DC signal terminals VDD_A and VDD_B (not shown). The DC signal terminals VDD_A and VDD_B may be arranged in a reset module of the shift register.

In an embodiment of the present disclosure, as shown in FIGS. 5 to 8, the first signal wiring is a clock signal wiring which is coupled to at least one of the first clock signal terminal, the second clock signal terminal, the fourth clock signal terminal, and the fifth clock signal terminal to correspondingly transmit at least one of the first clock signal CLKA, the second clock signal CLKB, the fourth clock signal CLKD and the fifth clock signal CLKE to the shift register. The second signal wiring is a DC signal wiring which is coupled to the first voltage terminal, the second voltage terminal, the third voltage terminal and the fourth voltage terminal to correspondingly apply at least one of the first voltage V1, the second voltage V2, the third voltage V3 and the fourth voltage V4 to the shift register.

In an embodiment of the present disclosure, the clock signal wiring may be coupled to the clock signal input terminals of the shift register through an intermediate wiring; and the DC signal wiring may be coupled to the DC signal terminals of the shift register through the intermediate wiring. The clock signal output by the clock signal wiring may be a high frequency signal, and the clock signal output by the DC signal wiring may be a low frequency signal, which however is not limited thereto and depends on a specific condition.

Figure 11:
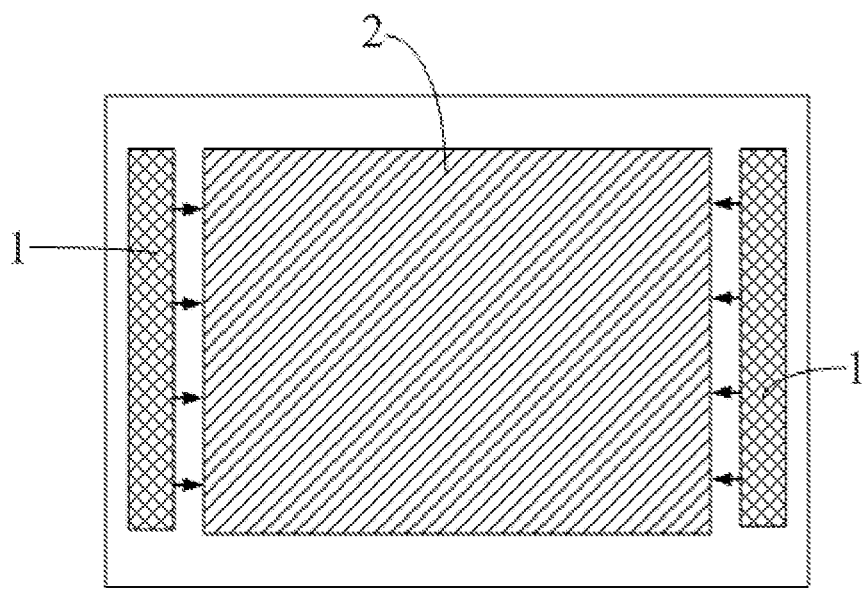
FIG. 11 shows a schematic plan view of an array substrate according to an embodiment of the present disclosure.

An embodiment of the present disclosure further provides an array substrate having a display area and a non-display area. The non-display area may be arranged around the display area. As shown in FIG. 11, the array substrate may include a display structure 2 and the gate driving structure 1 described in any one of the foregoing embodiments. The display structure 2 may include sub-pixel units arranged in an array, and the gate driving structure 1 may be configured to drive each of the sub-pixel units. The display structure 2 is arranged in the display area, and the gate driving structure 1 is arranged in the non-display area. Specifically, two gate driving structures 1 may be provided, and further, the two gate driving structures 1 are respectively arranged at two opposite sides of the display structure 2 in the row direction.

It should be understood that the display structure 2 may adopt a liquid crystal display (LCD) technology, or an organic light emitting diode (OLED) display technology.

An embodiment of the present disclosure further provides a display device, which includes the aforementioned array substrate. According to an embodiment of the present disclosure, the type of the display device is not particularly limited, and any type of display devices commonly used in the field may be feasible, for example, an LCD display, an OLED display, a mobile device such as a mobile phone, a wearable device such as a watch, a VR device and the like, which may be selected by those skilled in the art correspondingly according to a specific use of the display device, which will not be described in detail herein.

It should be noted that, in addition to a display panel, the display device further includes other necessary parts and components, for example, a display may further include a housing, a circuit board, a power line and the like, which can be correspondingly added by those skilled in the art according to a specific use thereof, and thus is not described in detail herein.

The terms "a", "an", "the" and "said" are used to indicate the presence of one or more elements/components/etc.; the terms "include" and "have" are used to indicate open-ended inclusion, and means that there may be other elements/components/etc. in addition to the listed elements/components/etc.; and the terms "first", "second" and the like are only used as markers, and do not limit the number of objects.

After considering the specification and practicing the invention disclosed herein, those skilled in the art will easily conceive of other embodiments of the present disclosure. The present disclosure is intended to cover any variations, uses, or adaptive changes of the present disclosure. These variations, uses, or adaptive changes follow the general principles of the present disclosure and include the common knowledge or customary technical means in the technical field not disclosed in the present disclosure. The specification and embodiments are only regarded as exemplary, and the true scope and spirit of the present disclosure are pointed out by the appended claims.

What is claimed is:

1. A gate driving structure, comprising:
a base substrate;
a shift register formed on the base substrate, and comprising a plurality of thin film transistors and at least one capacitor, the capacitor being coupled to the thin film transistor; and
a signal wiring group formed on the base substrate, and comprising a plurality of signal wirings spaced apart from each other, the signal wiring being coupled to the thin film transistor, wherein:
an orthographic projection of the capacitor on the base substrate is at least partially overlapped with an orthographic projection of the signal wiring group on the base substrate;
the base substrate comprises a first area and a second area, and the second area is arranged closer to a display area than the first area so that the second area is arranged at a side of the first area close to a display area;
the plurality of signal wirings comprise at least one first signal wiring and at least one second signal wiring, the at least one second signal wiring is coupled to at least one of the thin film transistors, an orthographic projection of the at least one first signal wiring on the base substrate is located in the first area, and an orthographic projection of the at least one second signal wiring on the base substrate is located in the second area;
the orthographic projection of the capacitor on the base substrate is located in the second area;
the capacitor comprises a first electrode layer, a first insulating layer, and a second electrode layer sequentially formed on the base substrate;
in the second area, the orthographic projection of the at least one second signal wiring on the base substrate is at least partially overlapped with orthographic projections of the first electrode layer, the first insulating layer, and the second electrode of the capacitor on the base substrate;
the at least one first signal wiring is a clock signal wiring for transmitting clock signal, and the at least one second signal wiring is a DC signal wiring for transmitting DC signal; and
the orthographic projection of the at least one first signal wiring on the base substrate is not overlapped with the orthographic projection of the capacitor on the base substrate,
wherein:
the base substrate further comprises a third area, and the third area is arranged at a side of the second area close to the display area, and an orthographic projection of at least one of the thin film transistors on the base substrate is located in the third area.

2. The gate driving structure according to claim 1, wherein:
the capacitor is located on a side of the second signal wiring facing the base substrate.

3. The gate driving structure according to claim 1, wherein:
the first electrode layer is arranged in a same layer as and is coupled to a gate layer of the thin film transistor in the shift register, and the second electrode layer is arranged in a same layer as and is coupled to a gate layer of a sub-pixel unit in a display area.

4. The gate driving structure according to claim 3, wherein the shift register further comprises an output line arranged in a same layer as the second electrode layer, and the output line comprises one end coupled to the second electrode layer and another end extending to a position where the display area is located and coupled to the gate layer of the sub-pixel unit.

5. A method, comprising providing the gate driving structure according to claim 1.

6. An array substrate, comprising:
a display area, a non-display area, a display structure, and a gate driving structure, the display structure being located in the display area, and the gate driving structure being located in the non-display area and coupled to the display structure, wherein the gate driving structure comprises:
a base substrate;
a shift register formed on the base substrate, and comprising a plurality of thin film transistors and at least one capacitor, the capacitor being coupled to the thin film transistor; and
a signal wiring group formed on the base substrate, and comprising a plurality of signal wirings spaced apart from each other, the signal wiring being coupled to the thin film transistor, wherein:
an orthographic projection of the capacitor on the base substrate is at least partially overlapped with an orthographic projection of the signal wiring group on the base substrate;
the base substrate comprises a first area and a second area, and the second area is arranged closer to a display area than the first area so that the second area is arranged at a side of the first area close to a display area;
the plurality of signal wirings comprise at least one first signal wiring and at least one second signal wiring, the at least one second signal wiring is coupled to at least one of the thin film transistors, an orthographic projection of the at least one first signal wiring on the base substrate is located in the first area, and an orthographic projection of the at least one second signal wiring on the base substrate is located in the second area;
the orthographic projection of the capacitor on the base substrate is located in the second area;
the capacitor comprises a first electrode layer, a first insulating layer, and a second electrode layer sequentially formed on the base substrate;
in the second area, the orthographic projection of the at least one second signal wiring on the base substrate is at least partially overlapped with orthographic projections of the first electrode layer, the first insulating layer, and the second electrode of the capacitor on the base substrate;
the at least one first signal wiring is a clock signal wiring for transmitting clock signal, and the at least one second signal wiring is a DC signal wiring for transmitting DC signal; and the orthographic projection of the at least one first signal wiring on the base substrate is not overlapped with the orthographic projection of the capacitor on the base substrate, wherein:

the base substrate further comprises a third area, and the third area is arranged at a side of the second area close to the display area, and an orthographic projection of at least one of the thin film transistors on the base substrate is located in the third area.

7. The array substrate according to claim 6, wherein: the capacitor is located on a side of the second signal wiring facing the base substrate.

8. The array substrate according to claim 6, wherein:
the first electrode layer is arranged in a same layer as and is coupled to a gate layer of the thin film transistor in the shift register, and the second electrode layer is arranged in a same layer as and is coupled to a gate layer of a sub-pixel unit in a display area.

9. The array substrate according to claim 8, wherein the shift register further comprises an output line arranged in a same layer as the second electrode layer, and the output line comprises one end coupled to the second electrode layer and another end extending to a position where the display area is located and coupled to the gate layer of the sub-pixel unit.

10. The array substrate according to claim 6, wherein:
the display structure comprises a plurality of sub-pixel units in a row direction and a column direction; and
the gate driving structure is arranged at one or two sides of the display area in the row direction.

11. The array substrate according to claim 10, wherein the plurality of signal wirings are spaced apart from each other in the row direction and extend in the column direction.

12. A display device, comprising:
an array substrate, comprising:
a display area, a non-display area, a display structure, and a gate driving structure, the display structure being located in the display area, and the gate driving structure being located in the non-display area and coupled to the display structure, the gate driving structure comprising:
a base substrate;
a shift register formed on the base substrate, and comprising a plurality of thin film transistors and at least one capacitor, the capacitor being coupled to the thin film transistor; and
a signal wiring group formed on the base substrate, and comprising a plurality of signal wirings spaced apart from each other, the signal wiring being coupled to the thin film transistor, wherein:
an orthographic projection of the capacitor on the base substrate is at least partially overlapped with an orthographic projection of the signal wiring group on the base substrate;
the base substrate comprises a first area and a second area, and the second area is arranged closer to a display area than the first area so that the second area is arranged at a side of the first area close to a display area;
the plurality of signal wirings comprise at least one first signal wiring and at least one second signal wiring, the at least one second signal wiring is coupled to at least one of the thin film transistors, an orthographic projection of the at least one first signal wiring on the base substrate is located in the first area, and an orthographic projections of the at least one second signal wiring on the base substrate is located in the second area;
the orthographic projection of the capacitor on the base substrate is located in the second area;
the capacitor comprises a first electrode layer, a first insulating layer, and a second electrode layer sequentially formed on the base substrate; and
in the second area, the orthographic projection of the at least one second signal wiring on the base substrate is at least partially overlapped with orthographic projections of the first electrode layer, the first insulating layer, and the second electrode of the capacitor on the base substrate;
the at least one first signal wiring is a clock signal wiring for transmitting clock signal, and the at least one second signal wiring is a DC signal wiring for transmitting DC signal; and
the orthographic projection of the at least one first signal wiring on the base substrate is not overlapped with the orthographic projection of the capacitor on the base substrate, wherein:

the base substrate further comprises a third area, and the third area is arranged at a side of the second area close to the display area, and an orthographic projection of at least one of the thin film transistors on the base substrate is located in the third area.

* * * * *